United States Patent
Chokkalingam et al.

(10) Patent No.: US 7,626,469 B2
(45) Date of Patent: Dec. 1, 2009

(54) ELECTRONIC CIRCUIT

(75) Inventors: Ramesh Chokkalingam, Tustin, CA (US); Matteo Conta, Irvine, CA (US)

(73) Assignee: GloNav Ltd., Dublin (IE)

( * ) Notice: Subject to any disclaimer, the term of this patent is extended or adjusted under 35 U.S.C. 154(b) by 40 days.

(21) Appl. No.: 12/105,042

(22) Filed: Apr. 17, 2008

(65) Prior Publication Data

US 2009/0261875 A1    Oct. 22, 2009

(51) Int. Cl.
    *H03B 1/04*    (2006.01)
    *H03L 7/085*   (2006.01)

(52) U.S. Cl. .................................. 331/105; 331/25

(58) Field of Classification Search .............. 331/8, 331/16–18, 25, 105
See application file for complete search history.

(56) References Cited

U.S. PATENT DOCUMENTS

2003/0016057 A1 *   1/2003   Donnelly et al. ............... 327/3

\* cited by examiner

*Primary Examiner*—David Mis
(74) *Attorney, Agent, or Firm*—Klarquist Sparkman, LLP

(57) ABSTRACT

An electric circuit, for use in a phase lock loop circuit, the electric circuit comprising: a first circuit element, being a phase frequency detector or a charge pump; at least one LC resonant loop, the first circuit element forming part of the loop; and means arranged to reduce ringing in said at least one LC resonant loop.

31 Claims, 6 Drawing Sheets

ELECTRONIC CIRCUIT

FIELD OF THE INVENTION

The present invention relates to an electric circuit for use in a phase lock loop circuit. In particular, the present invention relates to the design of phase frequency detectors and charge pumps, for use in such circuits.

BACKGROUND AND PRIOR ART

FIG. 1 shows a conventional fractional-n digital phase lock loop (PLL) circuit 100. The circuit includes a phase frequency detector (PFD) 101. The PFD 101 has two inputs. A first input 102 carries a reference signal. The reference signal is typically obtained from an incoming radio signal. A second input 103 originates from voltage controlled oscillator (VCO) 104. The output of the voltage controlled oscillator 104 is passed through divide by n counter 105. The output of the divide by n counter 105 is connected to the second input 103 of the PFD 101. The voltage control oscillator 104 and the divide by n counter 105 are set such that the signal arriving at the second input 103 is approximately the same frequency as the reference signal present at the first input 102.

The PFD 101 monitors the signals arriving at its two inputs. It is arranged to provide different outputs depending on the phase and frequency differences between the two input signals. If a wave front of the reference signal arriving at input 102 leads a wave front of the signal arriving at the second input 103, the PFD 101 outputs pulses via up output 106. The so-called UP signal varies in length depending on how much the two signals are out of phase. If a wave front of the signal arriving at the second input 103 leads a wave front of the reference signal arriving at the first input 102, then the PFD 101 outputs pulses at down output 107. The so-called DOWN signal varies in length depending on how much the two signals are out of phase. The circuit 100 also includes a charge pump 108. The charge pump has two inputs, one connected to up output 106, and one connected to down output 107. The charge pump includes current generators which are arranged to drive current towards output 109 or source current away from output 109. If the charge pump receives an UP signal, the charge pump drives current towards output 109. If the charge pump receives a DOWN signal, the charge pump sources current away from output 109.

The circuit also includes a low pass filter 110 which is connected to the charge pump via output 109. The low pass filter smoothes any signals being outputted by the charge pump 108. The low pass filter is connected to the VCO 104. When the PFD 101 produces an UP signal, the frequency of the signal being produced by the VCO 104 will increase. Thus, the signal arriving at the second input 103 will catch up with the reference signal. When the PFD 101 produces a DOWN signal, the frequency of the signal being produced by the VCO 104 will decrease. Thus, the signal arriving at the reference signal will catch up with the signal arriving at the second input 103.

In the above-described manner, the circuit produces a sinusoidal output signal at output 111 which is at the frequency of the reference signal, divided by N.

In order for a PLL circuit, such as circuit 100, to produce a pure sinusoidal output, the PFD 101, and hence the charge pump 108, needs to produce a linear output. A typical phase frequency detector includes a sigma delta modulator. Sigma delta modulators produce out-of-band phase errors. Any non-linearity in the PFD 101 will be folded into the PLL bandwidth. This creates in-band noise and spurs.

FIG. 2 is a graph of phase noise after the charge pump at an RF divider input after a divide by two in a PLL circuit known from the prior art. The x-axis is frequency in Hertz. The y-axis shows phase noise per Hertz in dBc/Hz units. As can be seen, the graph shows a non-linear phase detector and a linear, or ideal phase detector.

There are two known types of non-linearity in PFD circuits. These are integral non-linearity and differential non-linearity. FIGS. 3 and 4 are graphs showing differential non-linearity at the output of the charge pump which is caused by non-linearity in the PFD. FIG. 3 shows charge pump characteristics and phase error distribution. The x-axis is phase (ns) and the y-axis is normalized charge pump output charge every period. FIG. 4 shows the derivative of the charge pump characteristics. The x-axis is phase (ns) and the y-axis is the derivative of normalized charge pump output charge every period.

Differential non-linearity is not particularly well understood and there has been little or no identification or study of the causes of differential non-linearity in the available technical literature.

There is therefore a need for identification of causes for non-linearity and also for improved circuits designed to reduce non-linearity.

SUMMARY

The present disclosure provides an electric circuit, for use in a digital phase lock loop circuit, the electric circuit comprising: a first circuit element, being a phase frequency detector or a charge pump; at least one LC resonant loop, the first circuit element forming part of the loop; and means arranged to reduce ringing in said at least one LC resonant loop.

Another embodiment also provides a digital phase lock loop circuit including the electric circuit described above.

A further embodiment provides an electric circuit, for use in a digital phase lock loop circuit, the electric current comprising: a first circuit element, being a phase detector or a charge pump; the first circuit element comprising at least one power supply point and at least one output; wherein parasitic capacitances exists between said current paths; and said current paths are arranged in order to minimise said parasitic capacitances.

Another embodiment further provides an electric circuit, for use in a digital phase lock loop circuit, the electric circuit including a first circuit element being a phase frequency detector or a charge pump, the first element being connected via conductive tracks to power supply rails, wherein, in operation, parasitic inductances are formed along said conductive tracks and parasitic capacitances are formed between said supply rails such that LC resonant loops are formed which include said first circuit element, the electric circuit further comprising resistors connected between the conductive tracks and the power supply rails such that the resistors are connected in series with said parasitic inductances, the resistors reducing the Q factor of the LC resonant loops, thereby to reduce the non-linearity at the output of the first circuit element.

Another embodiment further provides a method of reducing non-linearity in a digital phase lock loop phase frequency detector circuit, the circuit comprising a first circuit element, being a phase frequency detector or a charge pump, the method comprising: identifying LC current loops formed by parasitic inductances and capacitances and which include the first circuit element; placing resistors in series with the parasitic inductances in order to reduce the Q factor of the LC loops.

Another embodiment further provides a method of reducing non-linearity in a digital phase lock loop phase frequency detector circuit, the circuit comprising a first circuit element, being a phase frequency detector or a charge pump, the method comprising: identifying LC current loops formed by parasitic inductances and capacitances and which include the first circuit element; placing at least one capacitor in parallel with the first circuit element in order to reduce the current flowing in the parasitic inductances.

Other features of the present invention are defined in the appended claims. Features and advantages associated with the present invention will be apparent from the following description of the preferred embodiments.

BRIEF DESCRIPTION OF THE DRAWINGS

The present invention will now be described by way of example only and with reference to the accompanying drawings in which.

DETAILED EMBODIMENTS

Figure 1:
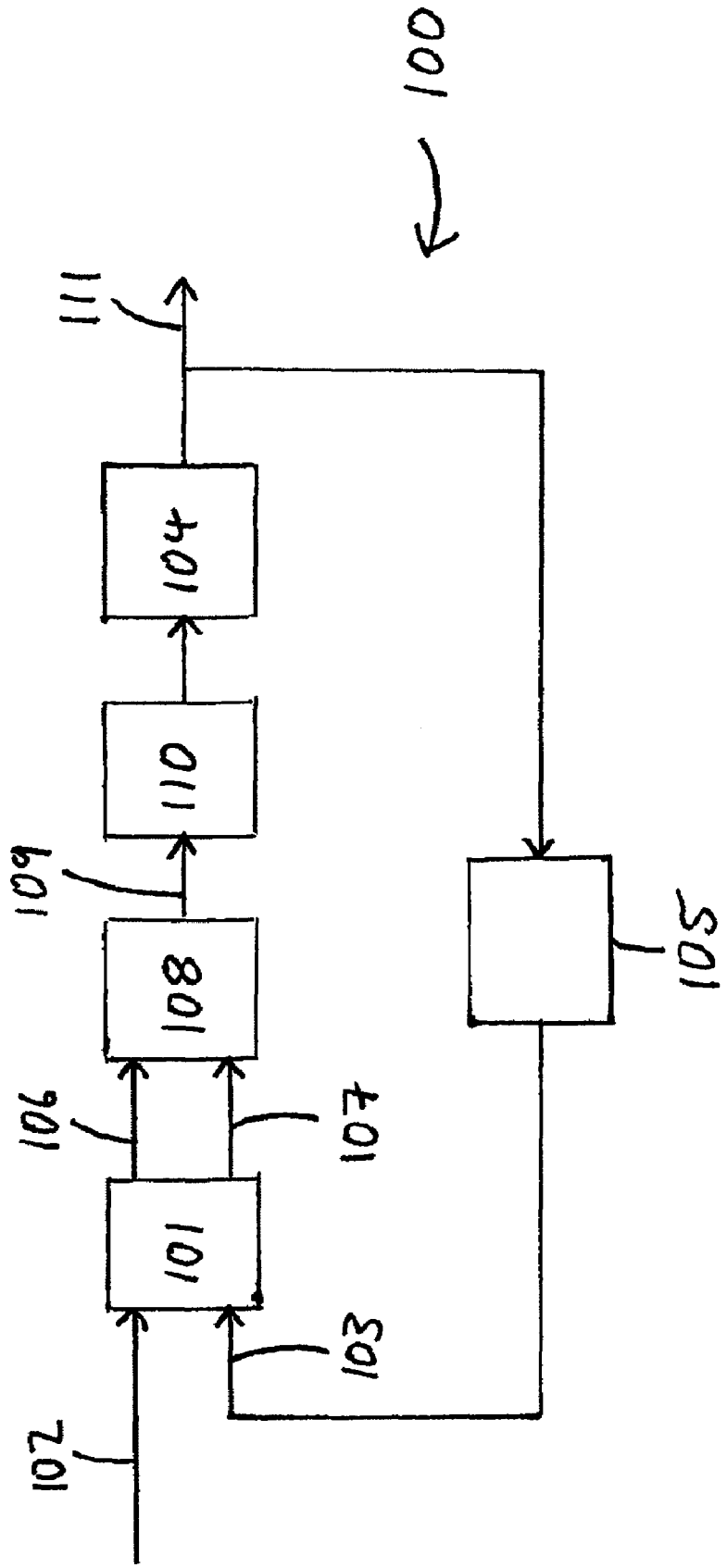
FIG. 1 is a schematic diagram of a phase lock loop circuit known from the prior art.
Figure 2:
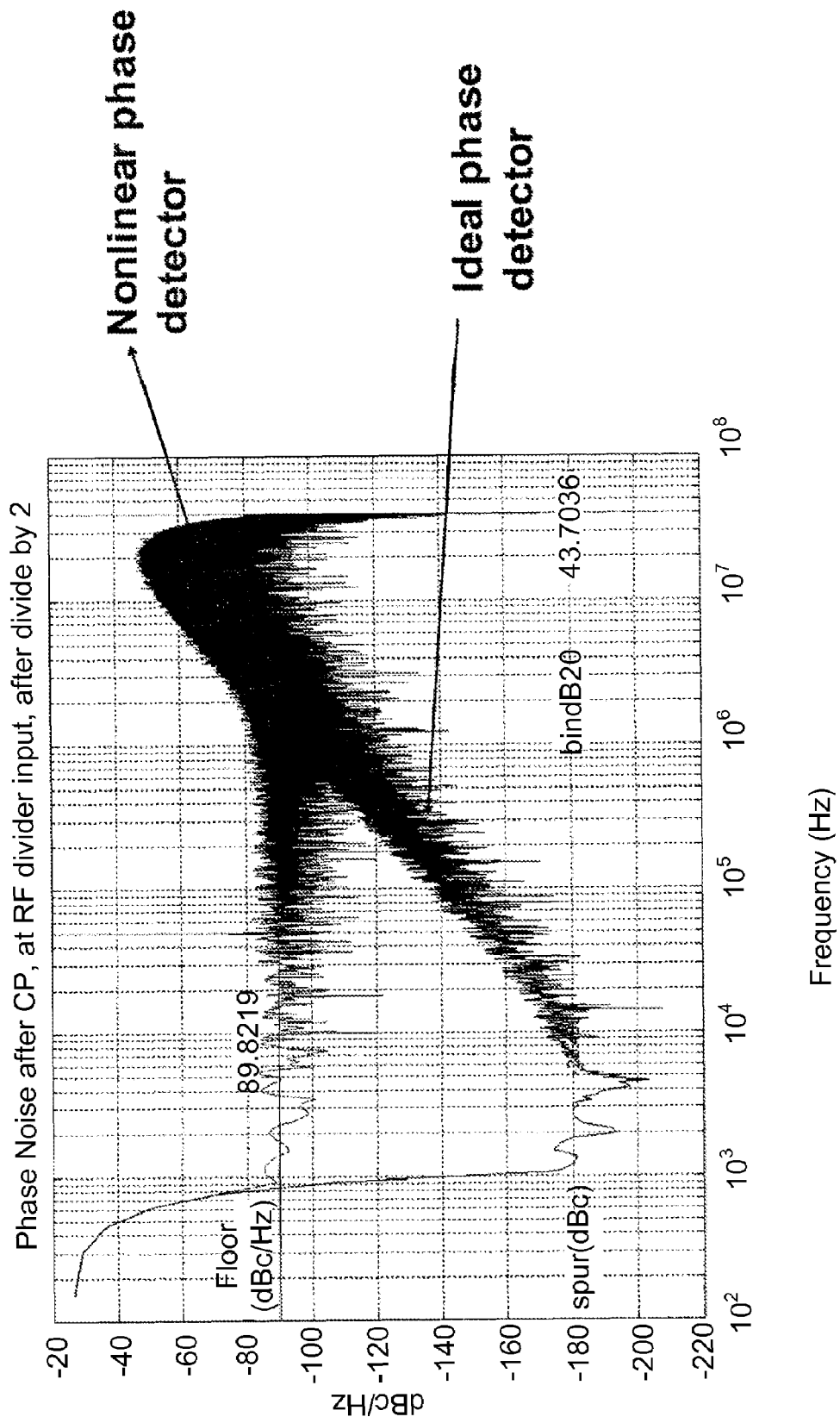
FIG. 2 is a graph showing phase noise after a charge pump output, at the RF divider input, after a divide by two for a PLL circuit known from the prior art and from an ideal PLL circuit.
Figure 3:
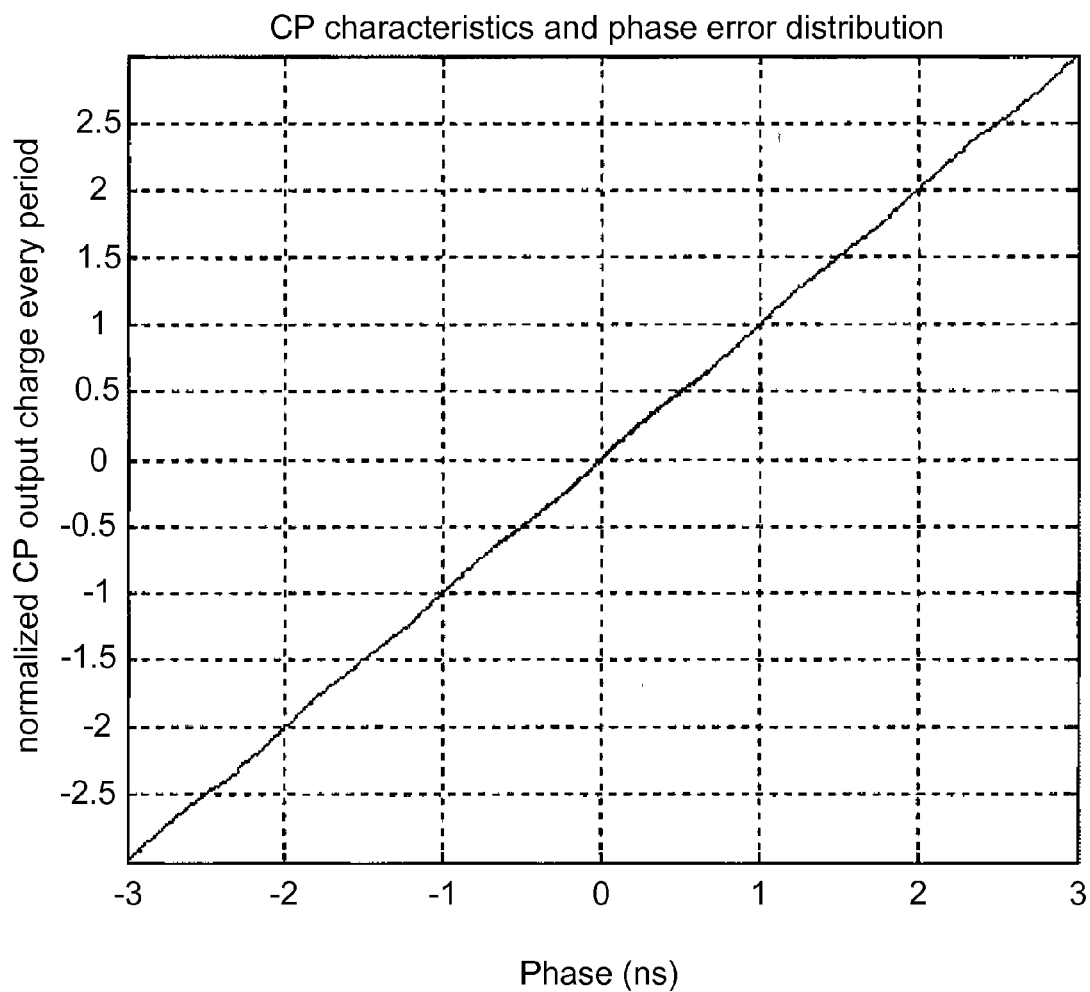
FIG. 3 is a graph showing the charge pump characteristics and phase area distribution for a charge pump known from the prior art.
Figure 4:
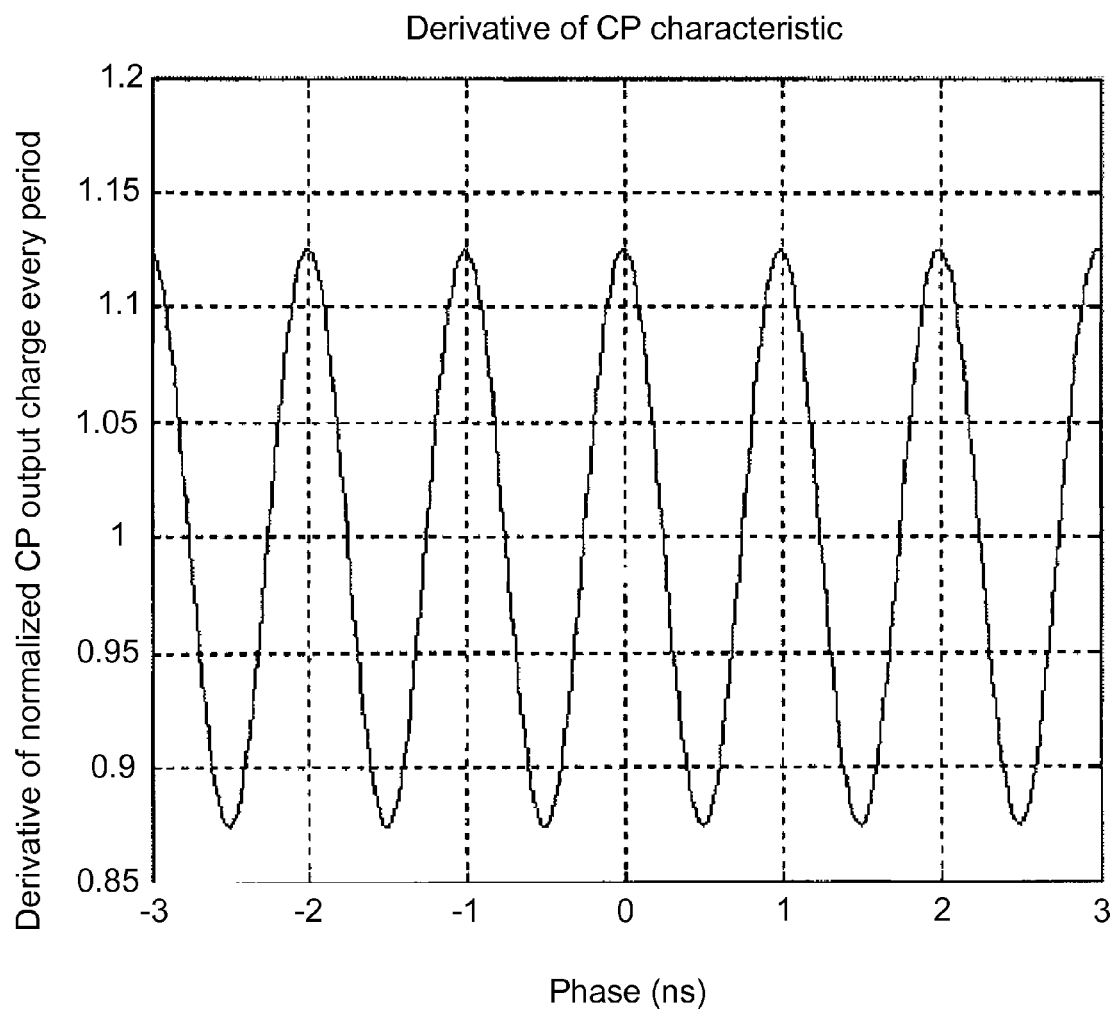
FIG. 4 is a graph showing the derivative of the charge pump characteristics of FIG. 3.
Figure 5:
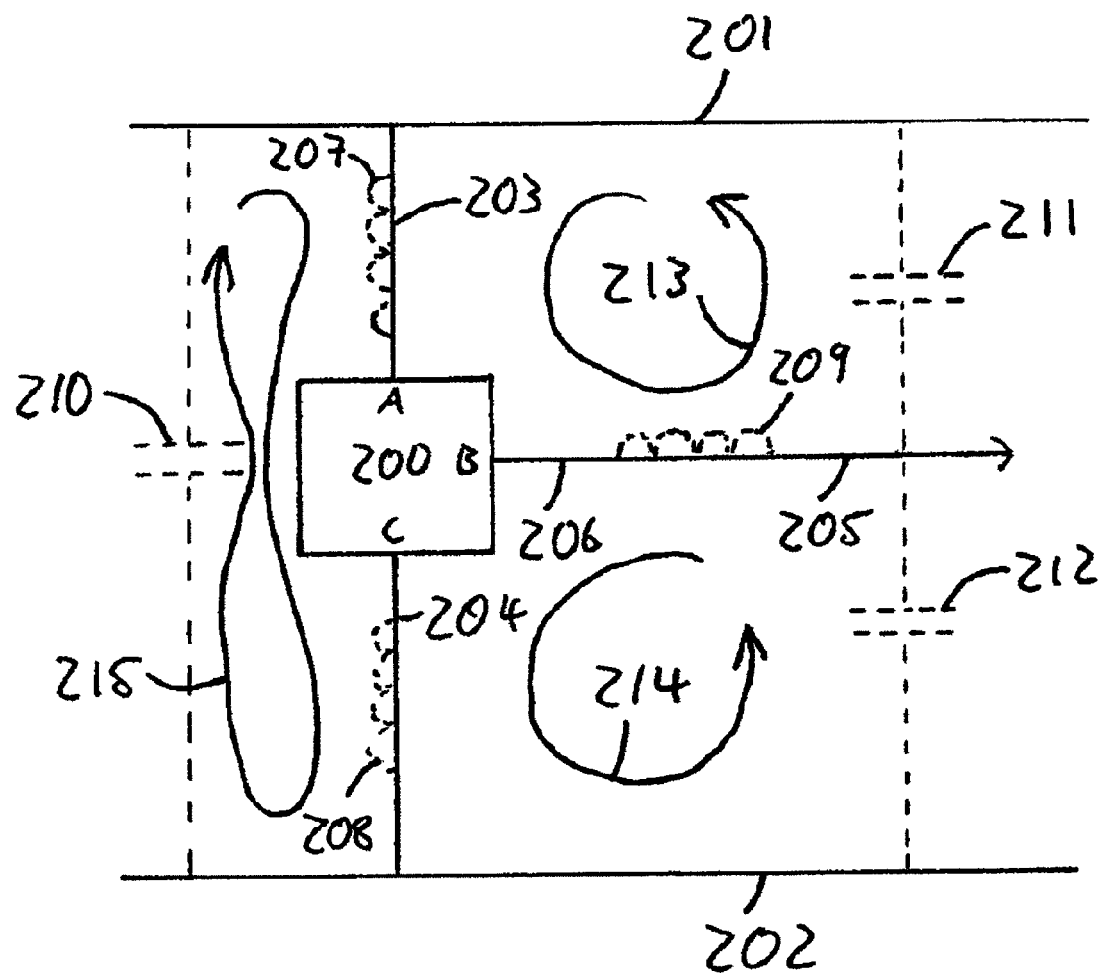
FIG. 5 is a schematic diagram of a charge pump known from the prior art.

The Applicant has investigated the causes of differential non-linearity in phase frequency detectors and charge pump circuits. FIG. 5 shows a charge pump 200 which is connected to power rails $V_{DD}$ 201 and $V_{SS}$ 202. The charge pump 200 is connected to $V_{DD}$ 201 via routing 203. The charge pump 200 is connected to $V_{SS}$ 202 via routing 204. The charge pump 200 has a single output 205 which includes routing 206. Routing 203, 204 and 206 each produce parasitic inductances 207, 208 and 209 during the operation of the charge pump 200. These routings can be either inside a chip in which the circuit is formed or inside a board on which the chip is mounted. In addition to parasitic inductances 207, 208, 209, the circuit shown in FIG. 5 includes parasitic capacitances 210, 211 and 212. The parasitic capacitances exist between output routing 206, supply rail $V_{DD}$ 201 and supply rail $V_{SS}$ 202.

In use, when the charge pump circuit 200 receives an UP signal, the charge pump drives current between point A and point B shown in FIG. 5. When the charge pump receives a DOWN signal, it drives current between point B and point C shown in FIG. 5. The Applicant has noted that these currents are being driven round LC circuits which are formed by the combination of the parasitic capacitances and inductances mentioned above. For example, an LC circuit is formed by the combination of parasitic inductance 207, parasitic inductance 209, parasitic capacitance 211 and $V_{DD}$ 201. When current is driven between A and B, a ringing loop 213 is produced in this resonant LC circuit.

An LC circuit is also formed by parasitic inductance 209, parasitic inductance 208, $V_{SS}$ 202 and parasitic capacitance 212. When current is driven between A and C, a ringing loop 214 is formed in this LC resonant circuit. A similar ringing loop 215 is also produced in the LC resonant circuit which comprises parasitic capacitance 210, parasitic inductance 207 and parasitic inductance 208.

Through efforts to reduce the currents flowing in these ringing loops by means of the circuits which will be described below, the Applicant has appreciated that these loops are a substantial contributor to differential non-linearity. By reducing the current flowing in these loops, the Applicant has noted a reduction in non-linearity present in a PFD.

Figure 6:
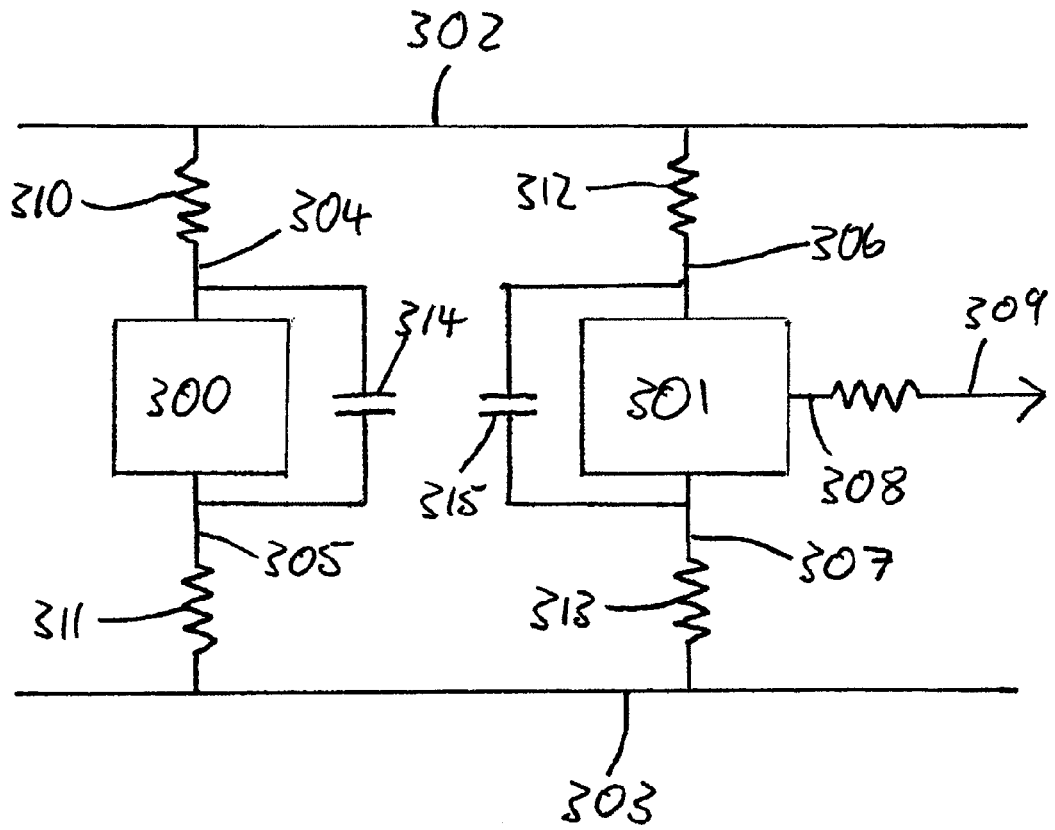
FIG. 6 is a schematic diagram of a phase frequency detector and a charge pump in accordance an embodiment of the present invention.

The circuit shown in FIG. 6, which is in accordance with an embodiment of the invention, shows various circuit elements which are designed to produce the effects of the ring loops 213, 214 and 215, and hence reduce the degree of non-linearity in the circuit. FIG. 6 shows a phase frequency detector 300 and a charge pump 301. Also shown are power rails $V_{DD}$ 302 and $V_{SS}$ 303. The PFD 300 and the charge pump 301 are connected to $V_{DD}$ 302 and $V_{SS}$ 303 by routing 304, 305, 306 and 307. The charge pump 301 has an output 308 which includes routing 309. The connections between the PFD 300 and the charge pump 301 are not shown.

The circuit shown in FIG. 6 also includes resistors 310, 311, 312 and 313. These resisters form part of routing 304, 305, 306 and 307 respectively. As with the circuit shown in FIG. 5, the routing 304, 305, 306 and 307 between the main circuit elements PFD 300 and charge pump 301 produce parasitic inductances when the circuit is in use. These inductances are not shown in FIG. 6. Resistors 310, 311, 312 and 313 are formed in series with the parasitic inductances formed in the routing 304, 305, 306 and 307. By introducing these resistances into the ringing LC loops, described in connection with FIG. 5, the Q factor of those loops is reduced. In turn, the degree of ringing in these loops is reduced. As noted above, the Applicant has appreciated that ringing in the LC loops gives rise to differential non-linearity. Hence, the inclusion of resistors 310, 311, 312 and 313 in the circuit shown in FIG. 5 results in a circuit with reduced non-linearity.

In addition to the above, the circuit shown in FIG. 6 also includes decoupling capacitors 314 and 315. These capacitors are effectively connected in parallel with PFD 300 and charge pump 301 respectively. Furthermore, capacitors 314, 315 are effectively connected in series with the parasitic inductances of routing 304, 305, 306 and 307. The effect of capacitors 314, 315 is to reduce the current flowing through the parasitic inductances of the routing 304, 305, 306 and 307. As a consequence, this reduces the effects of the ringing in the LC loops. In turn, this reduces the degree of non-linearity in the circuit.

The physical layout, on-chip, of the supply rail $V_{DD}$ 302 and $V_{SS}$ 303 as well as the output routing 309, is arranged so as to reduce the parasitic capacitances 210, 211 and 212 (shown in FIG. 5). In particular, where possible, crossing of these conductors should be avoided. Where crossing is required, the metal tracks on the chip should be positioned, vertically, far apart from each other so as to reduce the parasitic capacitances. Alternatively, metal tracks can be placed between the conductors 302, 303 and 309. In other words, $V_{DD}$ 302 is positioned on one surface the chip. A metal track is positioned on the other side of the chip, in alignment with $V_{DD}$ 302. Then, another layer of chip material is positioned adjacent the metal track. On the other side of that material is $V_{SS}$ 303. This sandwich arrangement reduces parasitic capacitances. Ideally, any such conductor should be connected to ground.

In order to reduce non-linearity in this manner, the ringing loops must be correctly identified. This involves an analysis of the circuit in question and identification of parasitic capacitances and inductances. The location of any current generators and the location of resultant currents is already known from the circuit design. It is therefore possible to identify, in any given circuit, the location of resulting LC resonant loops. Resistive circuit elements can then be placed in series with such loops in order to reduce ringing and therefore improve PFD output linearity.

For maximum effect, all three of the above techniques should be used. However, they can be used individually to a more limited degree. The use of parallel capacitors and series resistors provides the most significant advantages in terms of surprising improvement in the linearity of the PFD circuit.

Various modifications, changes and/or alterations may be made to the above described embodiments to provide further embodiments which use the underlying inventive concept, falling within the spirit and/or scope of the invention. Any such further embodiments are intended to be encompassed by the appended Claims.

The invention claimed is:

1. An electric circuit, for use in a digital phase lock loop circuit, the electric circuit comprising:
a first circuit element, being a phase frequency detector or a charge pump;
at least one LC resonant loop, the first circuit element forming part of the loop; and
means arranged to reduce ringing in said at least one LC resonant loop.

2. An electric circuit according to claim 1 wherein said first circuit element is arranged to generate currents which drives said at least one resonant loop.

3. An electric circuit according to claim 2, wherein said means to reduce the effects of ringing includes at least one resistor.

4. An electric circuit according to claim 3, wherein said LC resonant loop includes parasitic inductance.

5. An electric circuit according to claim 4, wherein said at least one resistor is positioned in series with said parasitic inductance.

6. An electric circuit according to claim 5, wherein said LC resonant loop further includes parasitic capacitance.

7. An electric circuit according to claim 6, wherein said resistor is arranged to reduce the Q factor of said LC resonant loop.

8. An electric circuit according to claim 7, further comprising a first power supply source, and a first current path, between the first circuit element and the first power supply source, and one of said at least one resistors being positioned in said first current path.

9. An electric circuit according to claim 8, further comprising a second power supply source, and a second current path, between said first circuit element and said second power supply source, and one of said at least one resistors, positioned in said second current path.

10. An electric circuit according to claim 9, wherein said power sources are power supply rails, one rail being at a positive voltage the other being at a negative voltage or ground.

11. An electric circuit according to claim 10, further comprising conductive tracks, wherein said current paths are formed by said at least one resistor and said conductive tracks, which are arranged in series between the first circuit element and said supply rails.

12. An electric circuit according to claim 11, wherein said parasitic inductances are formed in said conductive tracks.

13. An electric circuit according to claim 12, wherein said first circuit element includes at least one output, the circuit further comprising a third resistor being positioned in series with the output.

14. An electric circuit according to claim 13, wherein said parasitic capacitances are formed between said output and said power supply rails.

15. An electric circuit according to claim 1, further comprising a capacitive circuit element, wherein said first circuit element comprises first and second power supply points and said capacitive circuit element is connected in parallel with these points.

16. An electric circuit according to claim 15 wherein said capacitive element is arranged to reduce current flows along said current paths and hence through said parasitic inductances.

17. An electric circuit according to claim 16 wherein the physical positioning of said power rails and said at least one output is arranged to reduce said parasitic capacitances.

18. An electric circuit according to claim 17 wherein said power rails and said at least one output are positioned to avoid crossing.

19. An electric circuit according to claim 18, wherein said supply rails or at least one output overlap and said circuit further includes a conductor positioned between the overlapping supply rails or at least one output.

20. An electric circuit according to claim 19 wherein said conductor is connected to ground.

21. An electric circuit according to claim 20 further including a second circuit element, being a phase frequency detector, the first element being a charge pump.

22. A digital phase lock loop circuit including the electric circuit of claim 1.

23. An electric circuit according to claim 1, wherein said means to reduce ringing in said at least one LC resonant loop is at least one capacitor, and said at least one capacitor is connected in parallel with said first circuit element.

24. An electric circuit according to claim 23, wherein said first circuit element comprises at least two power supply points and said at least one capacitor is connected across those points.

25. An electric circuit according to claim 24, further comprising at least two power supply sources, each source being connected to one of said at least two power supply points.

26. An electric circuit according to claim 25 further comprising current paths between said first circuit element and said power supply sources, said paths having parasitic inductances.

27. An electric circuit according to claim 26 wherein said at least one capacitor is arranged in series with said inductances.

28. An electric circuit, for use in a digital phase lock loop circuit, the electric current comprising:
a first circuit element, being a phase detector or a charge pump;
the first circuit element comprising at least one power supply point and at least one output;
wherein parasitic capacitances exists between said current paths; and
said current paths are arranged in order to minimise said parasitic capacitances.

29. An electric circuit, for use in a digital phase lock loop circuit, the electric circuit including a first circuit element being a phase frequency detector or a charge pump, the first element being connected via conductive tracks to power supply rails, wherein, in operation, parasitic inductances are formed along said conductive tracks and parasitic capacitances are formed between said supply rails such that LC resonant loops are formed which include said first circuit element, the electric circuit further comprising resistors connected between the conductive tracks and the power supply rails such that the resistors are connected in series with said parasitic inductances, the resistors reducing the Q factor of the LC resonant loops, thereby to reduce the non-linearity at the output of the first circuit element.

30. A method of reducing non-linearity in a digital phase lock loop phase frequency detector circuit, the circuit comprising a first circuit element, being a phase frequency detector or a charge pump, the method comprising:

identifying LC current loops formed by parasitic inductances and capacitances and which include the first circuit element;

placing resistors in series with the parasitic inductances in order to reduce the Q factor of the LC loops.

31. A method of reducing non-linearity in a digital phase lock loop phase frequency detector circuit, the circuit comprising a first circuit element, being a phase frequency detector or a charge pump, the method comprising:

identifying LC current loops formed by parasitic inductances and capacitances and which include the first circuit element;

placing at least one capacitor in parallel with the first circuit element in order to reduce the current flowing in the parasitic inductances.

* * * * *